United States Patent [19]

Willocx et al.

[11] Patent Number: 5,341,108

[45] Date of Patent: Aug. 23, 1994

[54] AMPLIFIER BIASING CIRCUIT

[75] Inventors: Eddie L. M. Willocx, Willebroek; Johan G. A. Verkinderen, Torhout, both of Belgium

[73] Assignee: Alcatel N.V., Amsterdam, Netherlands

[21] Appl. No.: 991,585

[22] Filed: Dec. 15, 1992

[30] Foreign Application Priority Data

Dec. 16, 1991 [EP] European Pat. Off. ........ 91203307.3

[51] Int. Cl.⁵ .......................... H03F 3/45; H04M 1/00
[52] U.S. Cl. .................................... 330/259; 330/290; 379/405
[58] Field of Search ............... 330/259, 261, 250; 379/380, 382, 390, 399, 405

[56] References Cited

U.S. PATENT DOCUMENTS

| | | | |
|---|---|---|---|
| 4,292,478 | 9/1981 | Davis et al. | 379/405 X |
| 4,532,381 | 7/1985 | Rosenbaum et al. | 379/405 X |
| 5,075,540 | 12/1991 | Taniguchi et al. | 330/259 X |
| 5,136,259 | 8/1992 | Sato et al. | 330/261 |

FOREIGN PATENT DOCUMENTS

| | | | |
|---|---|---|---|
| 89113 | 5/1985 | Japan | 330/261 |
| 80108 | 3/1989 | Japan | 330/261 |

*Primary Examiner*—James B. Mullins
*Attorney, Agent, or Firm*—Robbins, Berliner & Carson

[57] ABSTRACT

This amplifier biasing circuit is used in a telecommunication ring trip circuit to control the bias of a sense amplifier (SA) having input terminals (I1, I2) coupled to output terminals (A, B) of a Herter bridge (R0/R5) which is also coupled to a telecommunication line (L) and to a ringing signal source (RC). The bias circuit is a negative feedback loop coupled between terminals I1 and I1, I2 of SA and regulates the voltage at the latter terminals to a reference value when the input voltage on terminal I1 exceeds a predetermined value in one direction, by connecting a variable bias impedance (R6, PNP1, R7, PNP2) between the amplifier input terminals and VBAT.

11 Claims, 1 Drawing Sheet

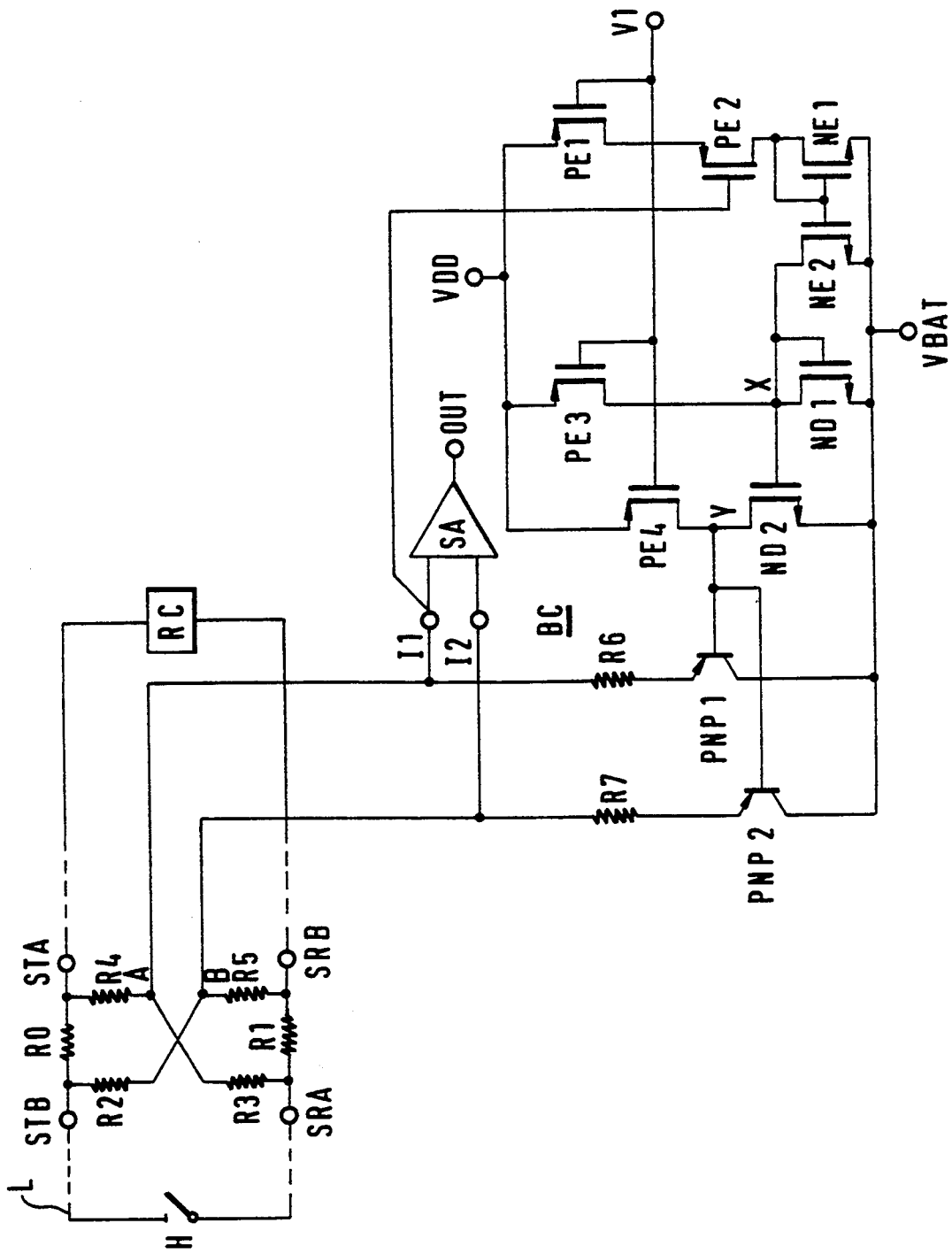

AMPLIFIER BIASING CIRCUIT

TECHNICAL FIELD

The present invention relates to an amplifier biasing circuit able to connect a bias impedance to an amplifier input to which an input signal is applied.

BACKGROUND ART

Such an amplifier biasing circuit is already known in the art and is for instance described in the published European patent application No 0455894 (which corresponds to commonly assigned copending application Ser. No. 07/699,954).

In this known biasing circuit the amplifier is a sense amplifier forming part of a telecommunication ring trip circuit also including a Herter bridge with a first pair of terminals coupled to a telecommunication line, with a second pair of terminals coupled to a ringing signal source and with the terminals of a third pair coupled to respective input terminals of the input of the sense amplifier. The purpose of this sense amplifier is to detect when during a ringing phase, i.e, when a ringing signal is applied to the line by the ringing signal source, a DC line loop becomes closed and to then provide a control signal to switch off the ringing signal, The biasing circuit connected to the input of this sense amplifier prevents the latter from being driven out of its operating range when the common mode voltage provided at its input by the ringing signal becomes too high. To this end the biasing circuit connects the bias impedance to the amplifier input via switches before the ringing signal is applied to it. Otherwise it disconnects this impedance via the same switches. This is correct since in this case the signal at the amplifier input is too small to drive this sense amplifier out of its operating range, thus making the need for biasing the input of the sense amplifier superfluous.

A first drawback of this known biasing circuit is that an outside control signal for driving the switches connecting and disconnecting the bias impedance must be available. A second drawback is that the impedance is varied in an abrupt way from infinite [switches open] in the absence of a ringing signal to a fixed value [switches closed, in the presence of such a signal. Indeed, by proceeding in this way the circuit may be active during a time longer than necessary and may therefore dissipate more power than strictly needed since when the ringing signal has low enough a magnitude in fact no biasing is needed.

DISCLOSURE OF INVENTION

An object of the present invention is to provide an amplifier biasing circuit of the above type, but which does not present these drawbacks.

According to the invention this object is achieved due to the fact that said biasing circuit detects the magnitude of said input signal and determines therefrom the value of said bias impedance.

In this way no outside control signal is required and the impedance value and the input signal magnitude may be so choosen that the input signal does not drive the amplifier out of its operating range, independently from the magnitude of the input signal being the result of the presence or absence of a ringing signal.

BRIEF DESCRIPTION OF THE DRAWINGS

The above mentioned and other objects and features of the invention will become more apparent and the invention itself will be best understood by referring to the following description of an embodiment taken in conjunction with the accompanying drawing which shows a schematic diagram of an amplifier biasing circuit according to the invention used in a telecommunication ring trip circuit.

BEST MODE FOR CARRYING OUT THE INVENTION

This ring trip circuit further includes a Herter bridge R0-R5. A first pair of terminals SRA, STB of this bridge is coupled to a subset (not shown) via a telecommunication line L for which a DC loop may be closed through a switch hook contact H, a second pair STA, SRB of its terminals is coupled to Zinc amplifiers (not shown) and to a ringing signal source RC and the two terminals A and B of a third pair are coupled to respective inputs I1 and I2 of a sense amplifier 5A. These inputs I1 and I2 are also coupled to like named terminals of a biasing circuit BC proper respectively.

The latter biasing circuit BC comprises transistors PE1 to PE4, NE1, NE2, ND1, ND2, PNP1 and PNP2 and resistors R6 and R7. PE1 to PE4 are PMOS transistors, NE1, NE2, ND1 and ND2 are NMOS transistors and PNP1 and PNP2 are PNP-type bipolar transistors. NE1 and ND1 are diode-connected transistors. All the MOS transistors are enhancement type transistors except for ND1 and ND2 which are of the depiction type. PE1, PE3 and PE4 constitute current sources as their source and gate electrodes are connected to constant voltages VDD and V1 respectively. VDD and VBAT are the poxes of a constant voltage source providing constant currents IA, IB and IC respectively.

Three transistor branches each comprising series connected transistors are connected across the latter poles VDD and VBAT, i.e. PE1, PE2, NE1; PE3 and ND1 which is connected in parallel with NE2; and PE4, ND2. Input I1 of amplifier SA is connected to the gate of PE1. WE1 and WE2 together constitute a current mirror circuit and the same is true for ND1 and ND2. The junction point X of PE3 and ND1, ND2 is connected to the gate of ND2, whilst the junction point Y of PE4 and ND2 is connected to the bases of both the transistors PNP1, and PNP2 which are connected in series with respective resistors R6 and R7 between respective terminals I1 and I2 and VBAT.

In what follows a description of the operation of the biasing circuit is given by making use of the following symbols, transistor X being a predefined transistor:

VD(1) : the voltage at the drain of transistor X;
VG(X) : the voltage at the gate of transistor X;
VS(l) : the voltage at the source of transistor X;
VGS(X) : the voltage at the gate of transistor X with respect to the source of transistor X,
VDS(X) = the voltage at the drain of transistor X with respect to the source of transistor X;
VT(X) : the threshold voltage of transistor X;
VC11 : the voltage at the first input I1 of the sense amplifier SA;
VB(X) : the voltage at the base of transistor X;
VE(X) : the voltage at the emitter of transistor X;
VC(X) : the voltage at the collector of transistor X;
VBE(X) : the voltage at the base of transistor X with respect to the emitter of transistor X.

Firefly it is assumed that the input voltage V(I1) on terminal I1 and which is equal to VG(PE2) is smaller than VDD +VT(PE2).

In this case transistor PE2 is conductive since VGS(PE2) which is equal to VG(PE2)−VS(PE2) is then smaller than VT(PE2) and VS(PE2) =VDD. Transistor PE2 conveys the current IA provided by current source transistor PE1 through the current mirror circuit comprising transistors NE1 and NE2. When it is assumed that this current mirror circuit NE1, NE2 has a conversion ratio equal to 1:k, NE2 would normally conduct a current equal to k. IA. However, this is impossible since current source transistor PE3 only generates a current IB which is assumed to be smaller than k. IA. Indeed, transistor ND1 cannot supply additional current to HE2 as it is only able to derive current from NE2. As a result the voltage at the drain of NE2 drops almost to the voltage VBAT, thereby preventing transistor ND1 from becoming conductive. Thus the current mirror circuit ND1, ND2 does not operate as a current mirror. As the voltage at the gate of ND2 is substantially equal to VBAT, the voltage VGS(ND2) is substantially equal to 0 V. Transistor ND2 is so designed that VDC(ND2) then becomes equal to VDD in order that it should be able to convey the current IC provided by current source PE4. Because VD(ND2) is nearly equal to VDD the voltages VBE(PNP1) and VBE(PNP2) are positive so that both transistors PNP1 and PNP2 are blocked. Hence no biasing is provided in this case.

Secondly, the case is considered wherein V(I2) is equal or larger than VT.

Because VGS(PE2) is equal or larger than VT(PE2), transistor PE2 acts as a voltage controlled resistance so that PE1 supplies to transistor NE1 a current which decreases with increasing V(I2). This means that current source PE1 does not work as a current source anymore, i.e. it no longer supplies a constant current independently from the voltage or impedance at its output. When the current I(NE1) in NE1 has lowered so much that the current I(NE1) flowing in NE2 is less than IB, i.e. when the current delivered by PE1 is less than IA/k, then VD(NE2) is able to Increase. Due to the fact that VD(NE2)=VD(ND1)=VG(ND1) a current will then flow in ND1 which is equal to the difference between the current IB supplied by current source PE3 and the current flowing in NE2.

The current flowing in ND1 is mirrored in ND2 which will convey the current IC provided by current source PE4, but now with VD(ND2) smaller than VDD. In other words, because VD(NE2) has increased, transistor ND2 is able to convey the current provided by current source PE4 with a lower VDS(ND2). As a consequence VB(PNP1) and VB(PNP2) both decrease so that the transistors PNP1 and PNP2 start conducting thereby providing bias to amplifier SA.

When the ringing voltage providing by the ringing signal source RC increases to such an extent that PE2 is blocked then no current flows neither in NE1 nor NE2, The current IB provided by the current source PE3 then completely flows through transistor ND1 and the current mirrored in ND2 is such that ND2 conveys the current IC provided by current source PE4, VD(ND2) then drops to almost the voltage of VBAT as a consequence of which the transistors PNP1 and PNP2 are fully conductive, This thereby provide a minimum resistance thus lowering V(I1) and giving a negative feedback effect since a higher V(I1) results in more bias and hence lower V(I1).

In the above way the voltage V(I1) at the input I1 is thus regulated to a substantially constant reference voltage as soon as this input voltage exceeds a predetermined reference value corresponding to the predetermined reference current IB, Also the voltage V(I2) and the input I2 is regulated in the same way as the common mode voltages on both these inputs are substantially equal, The above described bias circuit BC is in fact a negative feedback loop with input terminal I1 and output terminals I1 and I2, Input terminal I1 is coupled to a voltage controlled current source which comprises transistors PE1 and PE2 (acting as a voltage controlled resistance) and wherein the input voltage on terminal I1 is detected and converted to a current in NE1 which is equal to IA when the input voltage is such that PE2 is fully conductive, which decreases when PE2 becomes gradually blocked and which is zero when PE2 is fuzzy blocked, This current is mirrored in NE2 so as to produce an input control current I(NE2), HE2 which forms part of the voltage-to-current converter PE1, PE2, NE1, NE2 also constitutes a subtractor circuit together with PE3 and ND1 and generates in ND2 an error current I(ND2) equal to the difference of the reference current IB and the current I(NE2) in NE2, this difference current being however zero when the current in HE2 is larger than IB.

This error current is mirrored in ND2 and converted at the junction point Y of PEG and ND2 to an error voltage which decreases with increasing current in ND2, thereby connecting a correspondingly decreasing resistance between terminals I1, I2 and VBAT and thereby maintaining the input voltage at these terminals substantially constant and equal to a reference voltage.

From the above it follows that when, possibly due to the ringing signal being applied to the input terminal I1, the voltage at this terminal:
- is smaller than a predetermined value (VD +VTT) then this voltage is not affected as BC provides an infinite bias impedance by opening the connections between I1, I2 and VBAT;
- tries to increase above this predetermined value, i.e. exceeds this value in a predetermined direction, then BC maintains the input voltage substantially equal to a constant reference value by providing a correspondingly decreasing bias impedance.

While the principles of the invention have been described above in connection with specific apparatus, it is to be clearly understood that this description is made only by way of example and not as a limitation on the scope of the invention.

We claim:

1. Amplifier biasing circuit for connecting a bias impedance to an amplifier input to which an input signal is applied, said biasing circuit comprising
   means for detecting a magnitude of said input signal,
   means for determining from said magnitude a value of said bias impedance, and
   a negative feedback loop which maintains said magnitude substantially equal to a reference value if said magnitude exceeds said reference value in a predetermined direction.

2. Amplifier biasing circuit according to claim 1, wherein
   said amplifier input has at least two input terminals, said biasing circuit detects aid magnitude at only one of the input terminals and said biassing circuit further comprises means for connecting said bias impedance to each of said two input terminals.

3. Biasing circuit according to claim 2, wherein said negative feedback loop also maintains a second magnitude of said input signal at the other of said input terminals substantially equal to said reference value.

4. Amplifier biasing circuit for connecting a bias impedance to an input terminal of an amplifier, said biasing circuit comprising:

means for detecting a magnitude of an input signal at the input terminal; and a negative feedback loop which maintains said magnitude substantially equal to a reference value if said magnitude exceeds said reference value in a predetermined direction, said negative feedback loop further comprising:

first conversion means to convert the magnitude of said input signal which is a voltage signal to an input control current;

subtractor means coupled to said first conversion means and providing an error current function of the difference of a reference current and said input control current when said input control current is smaller than said reference current;

second conversion means to convert said error current to an error voltage; and voltage controlled impedance means providing said impedance under the control of said error voltage.

5. Amplifier biasing circuit according to claim 4, wherein said first conversion means includes a first current source, a voltage controlled resistance and an input part of a first current mirror circuit all connected in series between first and second poles of a DC supply source, said input voltage controlling said voltage controlled resistance and said input part being coupled to an output part of said first current mirror circuit.

6. Amplifier biasing circuit according to claim 5, wherein said subtractor means includes a second current source connected between said poles in series with the parallel connection of said output part of said first current mirror circuit and an input part of a second current mirror circuit, said output part of said first current mirror circuit providing said input control current and said input part of said second mirror circuit providing said error current.

7. Amplifier biasing circuit according to claim 6, wherein said second conversion means includes a third current source connected between said poles in series with a second part of said second current mirror circuit and providing said error voltage at a junction point of said third current source and said second part of said second current mirror circuit.

8. Amplifier biasing circuit according to claim 7, wherein said amplifier input has at least two input terminals, said biasing circuit detects said magnitude at only one of the input terminals, said biasing circuit further comprises means for connecting said bias impedance to each of said two input terminals, and said voltage controlled impedance means includes between each of said amplifier input terminals and said second pole, the series connection of a respective resistor and a respective transistor whose base is connected to said junction point.

9. Amplifier biasing circuit according to claim 5, wherein said voltage controlled resistance is constituted by a FET transistor whose gate is connected to said input terminal of said amplifier.

10. A telecommunication ring trip circuit comprising:

a sense amplifier having a pair of input terminals, a Herter bridge further comprising a first pair of terminals coupled to a telecommunication line, a second pair of terminals coupled to a ringing signal source and a third pair of terminals coupled to said input terminals, an amplifier biasing circuit for connecting a bias impedance to each of said input terminals, said biasing circuit further comprising means for detecting a magnitude of an input signal at one of said input terminals, means for determining from said magnitude a value of said bias impedance, and means for connecting said bias impedance to each of said input terminals, and a negative feedback loop which maintains said magnitude substantially equal to a reference value if said magnitude exceeds said reference value in a predetermined direction.

11. Biasing circuit according to claim 10, wherein said negative feedback loop also maintains a second magnitude of an input signal at another input terminal of said amplifier substantially equal to said reference value.

* * * * *